(12) United States Patent
Lee

(10) Patent No.: US 11,599,306 B2
(45) Date of Patent: Mar. 7, 2023

(54) MEMORY DEVICE

(71) Applicant: SK hynix Inc., Icheon-si (KR)

(72) Inventor: Yo Sep Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 17/328,492

(22) Filed: May 24, 2021

(65) Prior Publication Data
US 2022/0244889 A1 Aug. 4, 2022

(30) Foreign Application Priority Data
Feb. 2, 2021 (KR) .................. 10-2021-0015025

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC ... G11C 7/1006; G11C 16/22; G11C 16/0483; G11C 7/06; G11C 7/1018; G11C 7/1051; G11C 7/1075; G11C 11/408; G11C 16/12; G11C 16/3459; G11C 5/06; G11C 7/10; G11C 7/1042; G11C 7/1045; G11C 7/106; G11C 7/1066; G11C 7/18; G11C 7/22; G11C 8/08; G11C 8/12; G11C 11/419; G11C 11/5642; G11C 16/08; G11C 16/3404; G11C 2207/104; G11C 2207/2272; G11C 29/34; G11C 29/40; G11C 29/48; G11C 5/025; G11C 5/04; G11C 5/063; G11C 5/066; G11C 7/1027; G11C 7/1048; G11C 7/1063; G11C 7/1069; G11C 7/1072; G11C 7/1078; G11C 7/1096; G11C 7/12; G11C 8/04; G11C 8/16; G06F 9/3879; G06F 7/58; G06F 7/584; G06F 9/3885; G06F 9/3897; G06F 17/147; G06F 7/5443; G06F 15/7821; G06F 9/3001; G06F 1/3243; G06F 1/3287;
(Continued)

(56) References Cited

U.S. PATENT DOCUMENTS 8,902,675 B2 * 12/2014 Takagiwa ................. G11C 7/06
365/189.08

FOREIGN PATENT DOCUMENTS

KR 1019970076809 A 12/1997
KR 1020080002653 A 1/2008

* cited by examiner

*Primary Examiner* — Thong Q Le
(74) *Attorney, Agent, or Firm* — William Park & Associates Ltd.

(57) ABSTRACT

A memory device includes a data storage circuit configured to access a cell array having first data stored therein when an arithmetic active operation is performed, output the first data when a first read operation is performed, access a cell array having second data stored therein when an active operation is performed, and output the second data when a second read operation is performed. The memory device also includes an arithmetic circuit configured to receive latch data generated through the first read operation and read data generated through the second read operation, and perform an arithmetic operation on the latch data and the read data.

21 Claims, 18 Drawing Sheets

(51) Int. Cl.
  *G11C 7/06* (2006.01)
  *G11C 7/12* (2006.01)
  *G11C 7/10* (2006.01)
  *G11C 8/08* (2006.01)
  *G11C 8/10* (2006.01)
  *G06F 17/16* (2006.01)

(52) U.S. Cl.
  CPC ............... *G06F 17/16* (2013.01); *G11C 7/06* (2013.01); *G11C 7/106* (2013.01); *G11C 7/1063* (2013.01); *G11C 7/1069* (2013.01); *G11C 7/12* (2013.01); *G11C 8/08* (2013.01); *G11C 8/10* (2013.01)

(58) Field of Classification Search
  CPC ............. G06F 12/0207; G06F 12/0238; G06F 12/0284; G06F 12/0646
  See application file for complete search history.

MEMORY DEVICE

CROSS-REFERENCE TO RELATED APPLICATION

The present application claims priority under 35 U.S.C. § 119(a) to Korean application number 10-2021-0015025, filed in the Korean Intellectual Property Office on Feb. 2, 2021, the entire disclosure of which is incorporated herein by reference in its entirety.

BACKGROUND

The present disclosure relates to a memory device which performs an arithmetic operation.

A neural network indicates a network formed by interconnecting neurons as mathematical models in a similar manner to the brain of a human being. Recently, with the development of neural network technology, research is being actively conducted on various types of memory devices that analyze input data and extract valid information, by using the neural network technology.

SUMMARY

Some embodiments of the present disclosure are directed to a memory device capable of performing an arithmetic operation.

In an embodiment, a memory device may include: a data storage circuit configured to access a cell array having first data stored therein when an arithmetic active operation is performed, output the first data when a first read operation is performed, access a cell array having second data stored therein when an active operation is performed, and output the second data when a second read operation is performed; and an arithmetic circuit configured to receive latch data generated through the first read operation and read data generated through the second read operation, and perform an arithmetic operation on the latch data and the read data.

In another embodiment, a memory device may include: a row control circuit configured to receive an arithmetic row address which is generated when an arithmetic active operation is performed, and control a data storage circuit to access a cell array having first data stored in the cell array; a column control circuit configured to receive a first column address which is generated when a first read operation is performed, and control the data storage circuit to output the first data stored in the cell array accessed by the arithmetic active operation; and a data latch circuit configured to latch the first data based on a latch control signal, and output the latched first data as latch data used for an arithmetic operation.

In still another embodiment, a memory device may include: a row control circuit configured to receive an arithmetic row address which is generated when an arithmetic active operation is performed, control a data storage circuit to access a first cell array having first data stored in the first cell array, receive a row address which is generated when an active operation is performed, and control the data storage circuit to access a second cell array having second data stored in the second cell array; a column control circuit configured to receive a first column address which is generated when a first read operation is performed, control the data storage circuit to output the first data stored in the first cell array accessed by the arithmetic active operation, receive a second column address which is generated when a second read operation is performed, and control the data storage circuit to output the second data stored in the second cell array accessed by the active operation; a data latch circuit configured to latch the first data based on a latch control signal, and output the latched first data as latch data; an input/output sense amplifier configured to generate read data by sensing and amplifying the second data when the second read operation is performed; and an arithmetic circuit configured to perform an arithmetic operation on the latch data and the read data.

In accordance with some embodiments, a memory device may store data used for an arithmetic operation in a cell array accessed by an address, thereby storing the data used for an arithmetic operation in a small area.

Furthermore, in accordance with some embodiments, the cell array configured to store the data used for the arithmetic operation may be implemented as cells configured to store data whose logic levels are set by the supply voltage. Thus, the data can be stored in the cells without a write operation, which makes it possible to reduce the current consumption required for the arithmetic operation.

Furthermore, in accordance with some embodiments, the cell array configured to store the data used for the arithmetic operation may be implemented as cells configured to store data whose logic levels are set by the supply voltage. Thus, a refresh operation for retaining the data stored in the cells does not need to be performed, which makes it possible to reduce the current consumption required for the arithmetic operation.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second", which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Figure 1:
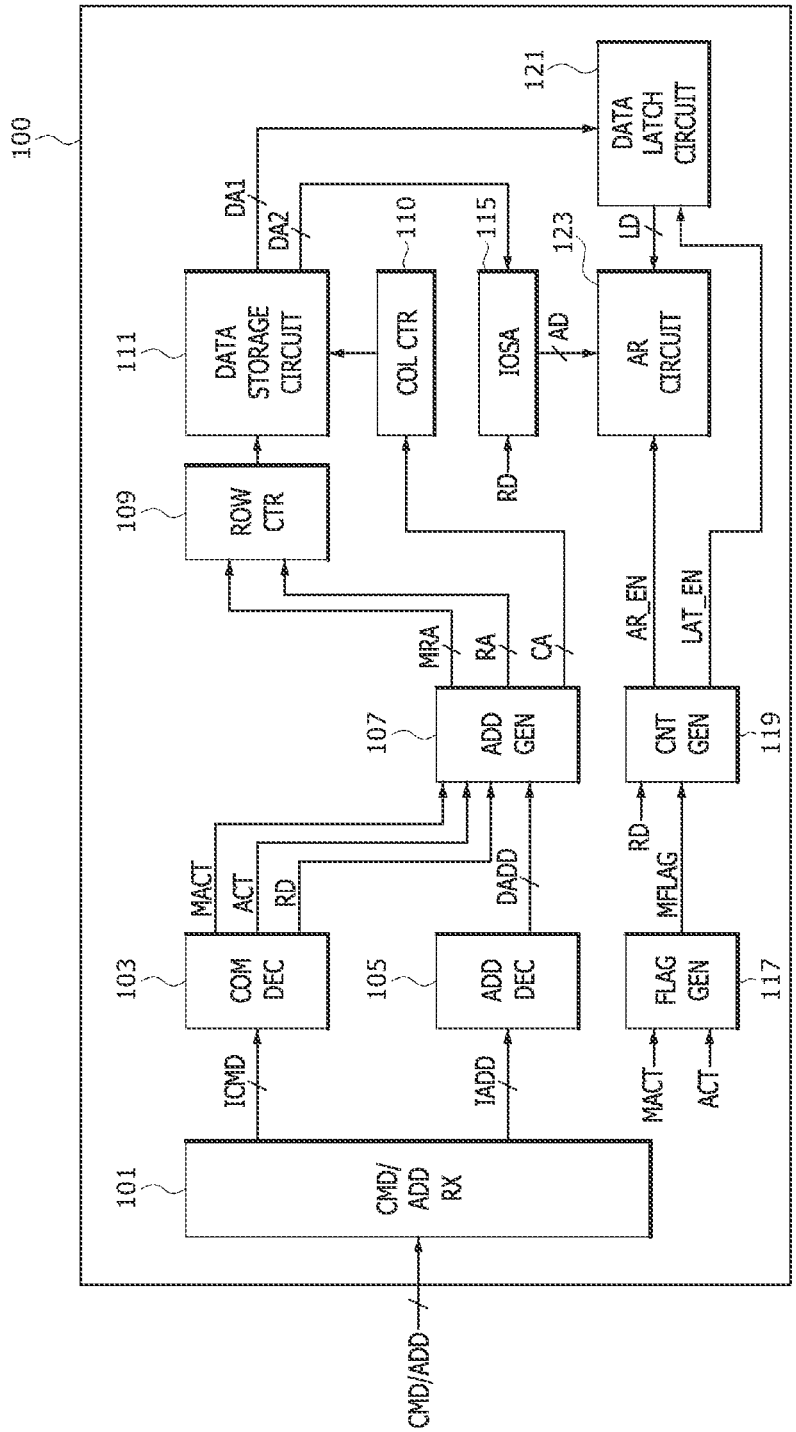
FIG. 1 is a block diagram illustrating a configuration of a memory device in accordance with an embodiment.

As illustrated in FIG. 1, a memory device 100 in accordance with an embodiment may include a command address receiving circuit (CMD/ADD RX) 101, a command decoder (COM DEC) 103, an address decoder (ADD DEC) 105, an address generation circuit (ADD GEN) 107, a row control circuit (ROW CTR) 109, a column control circuit (COL CTR) 110, a data storage circuit 111, an input/output sense amplifier (IOSA) 115, a flag generation circuit (FLAG GEN) 117, a control signal generation circuit (CNT GEN) 119, a data latch circuit 121 and an arithmetic circuit 123.

The command address receiving circuit 101 may receive, from the outside of the memory device 100, a command address CMD/ADD for performing various internal operations. The internal operations may include an arithmetic active operation, an active operation, a read operation, and the like. The command address CMD/ADD may include a command and address. The command address receiving circuit 101 may extract the command included in the command address CMD/ADD and output the extracted command as an internal command ICMD. The command address receiving circuit 101 may extract the address included in the command address CMD/ADD and output the extracted address as an internal address IADD. The number of bits included in each of the internal command ICMD and the internal address IADD may be set to various values in different embodiments.

The command decoder 103 may receive the internal command ICMD from the command address receiving circuit 101. The command decoder 103 may generate an arithmetic active signal MACT, an active signal ACT, and a read signal RD by decoding the internal command ICMD. The arithmetic active signal MACT may be activated to perform an arithmetic active operation. The arithmetic active operation may be performed to access a cell array having first data DA1 stored therein, among cells included in the data storage circuit 111. The active signal ACT may be activated to perform an active operation. The active operation may be performed to access a cell array having second data DA2 stored therein, among the cells included in the data storage circuit 111. The read signal RD may be activated to perform a read operation including a first read operation and a second read operation. The first read operation may be performed in order for the data latch circuit 121 to latch the first data DA1 accessed in the data storage circuit 111 and output the latched data as latch data LD. The second read operation may be performed in order for the input/output sense amplifier 115 to sense and amplify the second data DA2 accessed in the data storage circuit 111 and output the amplified data as read data AD. In the present embodiment, each of the arithmetic active signal MACT, the active signal ACT, and the read signal RD may be activated to a logic high level. However, this is only an example, and the present embodiment is not limited thereto.

The address decoder 105 may receive the internal address IADD from the command address receiving circuit 101. The address decoder 105 may generate a decoded address DADD by decoding the internal address IADD. The decoded address DADD may include information on an arithmetic row address MRA, a row address RA and a column address CA. When the arithmetic active signal MACT is activated for the arithmetic active operation, the decoded address DADD may include information on the arithmetic row address MRA. When the active signal ACT is activated for the active operation, the decoded address DADD may include information on the row address RA. When the read signal RD is activated for the read operation, the decoded address DADD may include information on the column address CA.

The address generation circuit 107 may receive the arithmetic active signal MACT, the active signal ACT, and the read signal RD from the command decoder 103. The address generation circuit 107 may receive the decoded address DADD from the address decoder 105. The address generation circuit 107 may generate the arithmetic row address MRA, the row address RA, and the column address CA from the decoded address DADD. When the arithmetic active signal MACT is activated for the arithmetic active operation, the address generation circuit 107 may generate the arithmetic row address MRA from the decoded address DADD. The address generation circuit 107 may latch the decoded address DADD to perform the arithmetic active operation, and output the latched decoded address DADD as the arithmetic row address MRA. When the active signal ACT is activated for the active operation, the address generation circuit 107 may generate the row address RA from the decoded address DADD. The address generation circuit 107 may latch the decoded address DADD to perform the active operation, and output the latched decoded address DADD as the row address RA. When the read signal RD is activated for the read operation, the address generation circuit 107 may generate the column address CA from the decoded address DADD. The address generation circuit 107 may latch the decoded address DADD to perform the read operation, and output the latched decoded address DADD as the column address CA.

The row control circuit 109 may receive the arithmetic row address MRA and the row address RA from the address generation circuit 107. The row control circuit 109 may receive the arithmetic row address MRA from the address generation circuit 107 in order to perform the arithmetic active operation. The row control circuit 109 may receive the arithmetic row address MRA, and control the data storage circuit 111 to access the cell array having the first data DA1 stored therein, among the cells included in the data storage circuit 111. The row control circuit 109 may receive the row address RA from the address generation circuit 107 in order to perform the active operation. The row control circuit 109 may receive the row address RA, and control the data storage circuit 111 to access the cell array having the second data DA2 stored therein, among the cells included in the data storage circuit 111.

The column control circuit 110 may receive the column address CA from the address generation circuit 107. The column control circuit 110 may receive the column address CA from the address generation circuit 107 in order to perform the read operation including the first and second read operations. The column control circuit 110 may control the data storage circuit 111 to output and apply the first data DA1 to the data latch circuit 121 during the first read operation. The column control circuit 110 may control the data storage circuit 111 to output and apply the second data DA2 to the input/output sense amplifier 115 during the second read operation.

The data storage circuit 111 may be controlled by the row control circuit 109 when the arithmetic active operation or the active operation is performed. The data storage circuit 111 may be controlled by the row control circuit 109 when the arithmetic active operation is performed, and access the cell array having the first data DA1 stored therein, among the cells included in the data storage circuit 111. The data storage circuit 111 may be controlled by the row control circuit 109 when the active operation is performed, and access the cell array having the second data DA2 stored therein, among the cells included in the data storage circuit 111. The data storage circuit 111 may be controlled by the column control circuit 110 when the first or second read operation is performed. The data storage circuit 111 may be controlled by the column control circuit 110 when the first read operation is performed, and output and apply the first data DA1, accessed during the arithmetic active operation, to the data latch circuit 121. The data storage circuit 111 may be controlled by the column control circuit 110 when the second read operation is performed, and output and apply the second data DA2, accessed during the active operation, to the input/output sense amplifier 115.

The input/output sense amplifier 115 may receive the read signal RD from the command decoder 103. The input/output sense amplifier 115 may receive the second data DA2 from the data storage circuit 111. The input/output sense amplifier 115 may generate the read data AD by sensing and amplifying the second data DA2, when the active operation is performed and the second read operation is performed. The input/output sense amplifier 115 may apply the read data AD, generated through the second read operation, to the arithmetic circuit 123.

The flag generation circuit 117 may receive the arithmetic active signal MACT and the active signal ACT from the command decoder 103. The flag generation circuit 117 may generate an arithmetic flag MFLAG based on the arithmetic active signal MACT and the active signal ACT. The flag generation circuit 117 may generate the arithmetic flag MFLAG which is activated when the arithmetic active signal MACT is activated, and generate the arithmetic flag MFLAG which is deactivated when the active signal ACT is activated. In the present embodiment, the arithmetic flag MFLAG may be activated to a logic high level. However, this is only an example, and the present embodiment is not limited thereto.

The control signal generation circuit 119 may receive the read signal RD from the command decoder 103. The control signal generation circuit 119 may receive the arithmetic flag MFLAG from the flag generation circuit 117. The control signal generation circuit 119 may generate a latch control signal LAT_EN and an arithmetic control signal AR_EN based on the read signal RD and the arithmetic flag MFLAG.

The control signal generation circuit 119 may activate the latch control signal LAT_EN based on the arithmetic active operation and the first read operation. The control signal generation circuit 119 may generate the latch control signal LAT_EN which is activated when a preset read delay period has elapsed after the read signal RD was activated with the arithmetic flag MFLAG set to a first logic level. The control signal generation circuit 119 may activate the arithmetic control signal AR_EN based on the active operation and the second read operation. The control signal generation circuit 119 may generate the arithmetic control signal AR_EN which is activated when the preset read delay period has elapsed after the read signal RD was activated with the arithmetic flag MFLAG set to a second logic level.

The data latch circuit 121 may receive the first data DA1 from the data storage circuit 111. The data latch circuit 121 may receive the latch control signal LAT_EN from the control signal generation circuit 119. The data latch circuit 121 may generate the latch data LD from the first data DA1 based on the latch control signal LAT_EN. The data latch circuit 121 may latch the first data DA1 when the latch control signal LAT_EN is activated after the arithmetic active operation and the first read operation are performed, and output the latched first data DA1 as the latch data LD. The data latch circuit 121 may apply the latch data LD, generated through the first read operation, to the arithmetic circuit 123.

The arithmetic circuit 123 may receive the read data AD from the input/output sense amplifier 115. The arithmetic circuit 123 may receive the arithmetic control signal AR_EN from the control signal generation circuit 119. The arithmetic circuit 123 may receive the latch data LD from the data latch circuit 121. The arithmetic circuit 123 may receive the latch data LD according to the first read operation, and receive the read data AD according to the second read operation. The arithmetic circuit 123 may perform an arithmetic operation on the latch data LD and the read data AD based on the arithmetic control signal AR_EN. The arithmetic circuit 123 may perform an arithmetic operation on the latch data LD and the read data AD when the arithmetic control signal AR_EN is activated at a point of time that the read delay period has elapsed after the first or read operation was performed. The arithmetic operation may include an addition operation, a multiplication operation, a division operation, and the like. The arithmetic operation may be a multiply-accumulate (MAC) operation used in a neural network. The MAC operation may include a multiplication operation and an addition operation on vector data and weight data. When the vector data and the weight data are implemented in the form of a matrix, the MAC operation may include a plurality of multiplication operations and a plurality of addition operations on elements included in the matrix of the vector data and elements included in the matrix of the weight data. In a neutral network, the MAC operation is performed to classify features included in an input layer into result values included in an output layer. The vector data may include the numerical values of the features included in the input layer. The weight data may include numeral values for the extent of influence on the operation of classifying the features of the input layers into the result values included in the output layer. In the present embodiment, the latch data LD may be set to the weight data, and the read data AD may be set to the vector data. In another embodiment, however, the latch data LD may be set to the vector data, and the read data AD may be set to the weight data.

Figure 2:
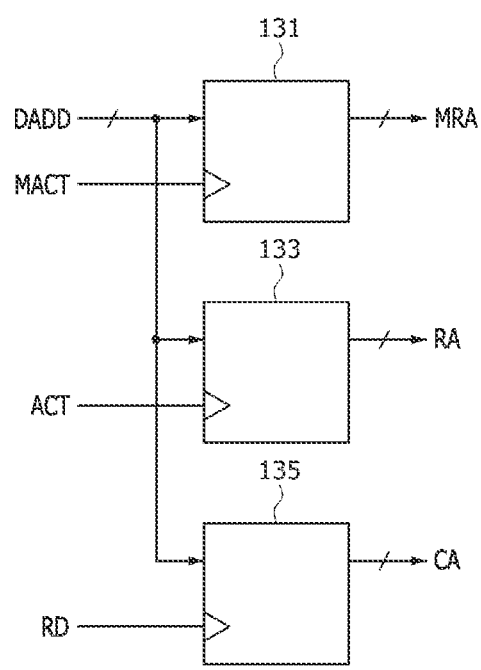
FIG. 2 is a diagram illustrating an example of an address generation circuit included in the memory device illustrated in FIG. 1.

As illustrated in FIG. 2, the address generation circuit 107 may include an arithmetic row address generation circuit 131, a row address generation circuit 133, and a column address generation circuit 135. The arithmetic row address generation circuit 131 may generate the arithmetic row address MRA based on the decoded address DADD. The arithmetic row address generation circuit 131 may latch the decoded address DADD when the arithmetic active operation is performed to activate the arithmetic active signal MACT, and output the latched decoded address DADD as the arithmetic row address MRA. The row address generation circuit 133 may generate the row address RA based on the decoded address DADD. The row address generation circuit 133 may latch the decoded address DADD when the active operation is performed to activate the active signal ACT, and output the latched decoded address DADD as the row address RA. The column address generation circuit 135 may generate the column address CA based on the decoded address DADD. The column address generation circuit 135 may latch the decoded address DADD when the first or second read operation is performed to activate the read signal RD, and output the latched decoded address DADD as the column address CA.

Figure 3:
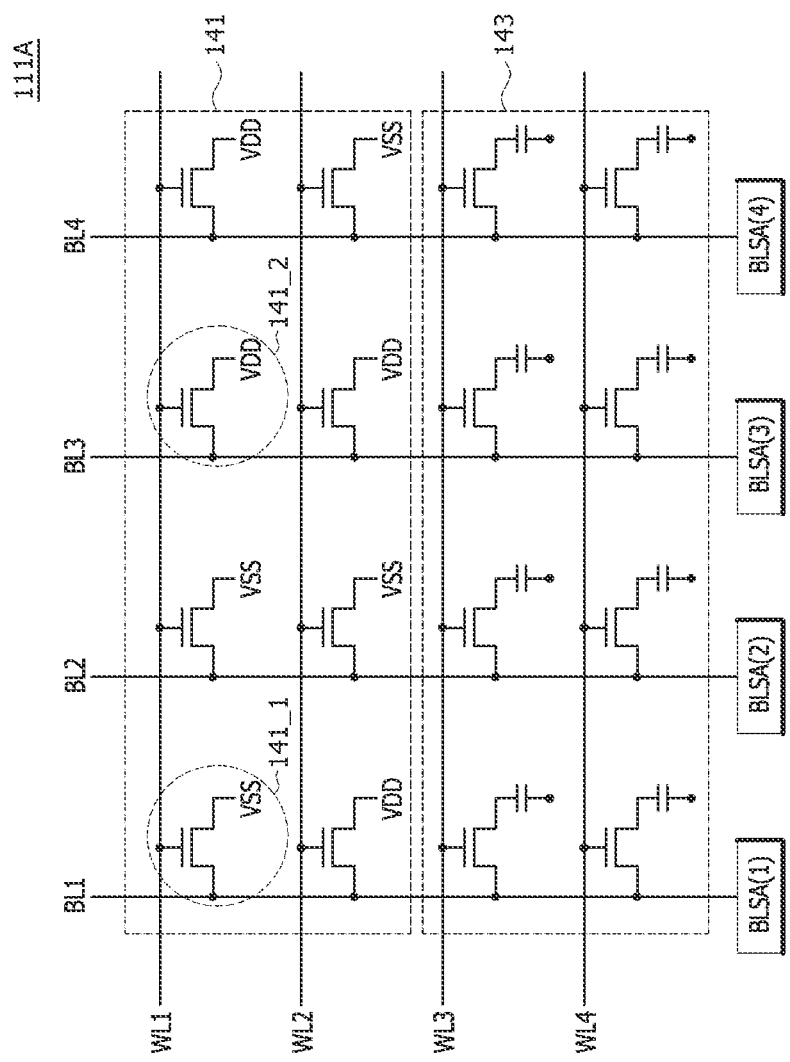
FIG. 3 is a diagram illustrating an example of a data storage circuit included in the memory device illustrated in FIG. 1.

FIG. 3 is a diagram illustrating a configuration of a data storage circuit 111A in accordance with an example of the data storage circuit 111. As illustrated in FIG. 3, the data storage circuit 111A may include a first cell array 141, a second cell array 143, and first to fourth bit line sense amplifiers BLSA(1) to BLSA(4).

The first cell array 141 may include fixed cells configured to store data based on a supply voltage VDD and a ground voltage VSS. For example, the first cell array 141 may include a fixed cell 141_1 configured to store a logic low level 'L' when the ground voltage VSS is applied thereto, and a fixed cell 141_2 configured to store a logic high level 'H' when the supply voltage VDD is applied thereto. Because data are stored in the fixed cells included in the first cell array 141 when the supply voltage VDD and the ground voltage VSS are applied to the fixed cells, a separate write operation night not be needed to thereby reduce current consumption. Furthermore, because the data stored in the fixed cells included in the first cell array 141 are retained by the supply voltage VDD and the ground voltage VSS, a separate refresh operation might not be needed to thereby reduce current consumption. The first cell array 141 may store 'L, L, H, and H' in fixed cells accessed by a first word line WL1 and first to fourth bit lines BL1 to BL4, when the supply voltage VDD and the ground voltage VSS are applied thereto. The first cell array 141 may store 'H, L, H, and L' in fixed cells accessed by a second word line WL2 and the first to fourth bit lines BL1 to BL4, when the supply voltage VDD and the ground voltage VSS are applied thereto. In the present embodiment, at least one of the first and second word lines WL1 and WL2 may be selected by the arithmetic row address MRA when the arithmetic active operation is performed. In the present embodiment, at least one of the first to fourth bit lines BL1 to BL4 may be selected by the column address CA when the arithmetic active operation is performed. In the present embodiment, the fixed cells included in the first cell array 141 may be accessed when the arithmetic active operation is performed, and may output the first data DA1 stored therein to at least one of the first to fourth bit line sense amplifiers BLSA(1) to BLSA(4). For example, when the arithmetic active operation is performed on the fixed cells accessed by the second word line WL2 and the first to fourth bit lines BL1 to BL4, 'H, L, H, and L' outputted from the first cell array 141 may be outputted to the first to fourth bit line sense amplifiers BLSA(1) to BLSA(4). In an embodiment, the fixed cells included in the first cell array 141 may be accessed when the active operation is performed, and may output the second data DA2 to at least one of the first to fourth bit line sense amplifiers BLSA(1) to BLSA(4). In an embodiment, at least one of the first and second word lines WL1 and WL2 coupled to the fixed cells included in the first cell array 141 may be selected by the row address RA when the active operation is performed. Furthermore, in an embodiment, at least one of the first to fourth bit lines BL1 to BL4 coupled to the fixed cells included in the first cell array 141 may be selected by the column address CA when the active operation is performed.

The second cell array 143 may include cells which are coupled to and accessed by the third and fourth word lines WL3 and WL4 and the first to fourth bit lines BL1 to BL4. In the present embodiment, at least one of the third and fourth word lines WL3 and WL4 may be selected by the row address RA when the active operation is performed. In the present embodiment, at least one of the first to fourth bit lines BL1 to BL4 may be selected by the column address CA when the active operation is performed. In the present embodiment, the cells included in the second cell array 143 may be accessed when the active operation is performed, and may output the second data DA2 stored therein to at least one of the first to fourth bit line sense amplifiers BLSA(1) to BLSA(4). In an embodiment, the cells included in the second cell array 143 may be accessed when the arithmetic active operation is performed, and may output the first data DA1 to at least one of the first to fourth bit line sense amplifiers BLSA(1) to BLSA(4). Furthermore, in an embodiment, at least one of the third and fourth word lines WL3 and WL4 coupled to the cells included in the second cell array 143 may be selected by the arithmetic row address MRA when the arithmetic active operation is performed. Furthermore, in an embodiment, at least one of the first to fourth bit lines BL1 to BL4 coupled to the cells included in the second cell array 143 may be selected by the column address CA when the arithmetic active operation is performed.

Figure 4:
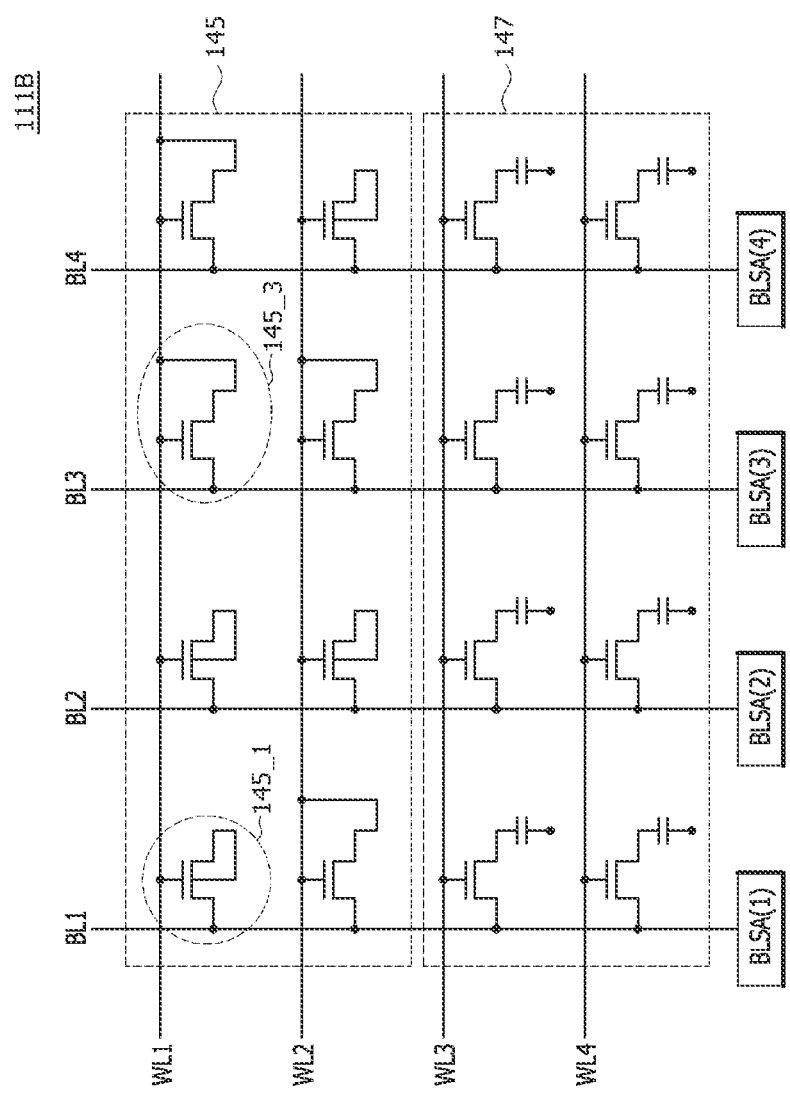
FIG. 4 is a diagram illustrating another example of the data storage circuit included in the memory device illustrated in FIG. 1.

FIG. 4 is a diagram illustrating a configuration of a data storage circuit 111B in accordance with another example of the data storage circuit 111. As illustrated in FIG. 4, the data storage circuit 111B may include a first cell array 145, a second cell array 147, and first to fourth bit line sense amplifiers BLSA(1) to BLSA(4).

The first cell array 145 may include fixed cells configured to store data based on a supply voltage VDD and a ground voltage VSS. For example, the first cell array 145 may include a fixed cell 145_1 having a source coupled to a bulk thereof and a fixed cell 145_3 having a source coupled to a first word line WL1. The fixed cell 145_1 may store a logic low level 'L' through a bulk thereof, which is driven to the ground voltage VSS, when the ground voltage VSS is applied thereto. Furthermore, the fixed cell 145_3 may store a logic high level 'H' through the first word line WL1 which is driven to the supply voltage VDD, when the supply voltage VDD is applied thereto. Because data are stored in the fixed cells included in the first cell array 145 when the supply voltage VDD and the ground voltage VSS are applied to the fixed cells, a separate write operation may not be needed to thereby reduce current consumption. Furthermore, because the data stored in the fixed cells included in the first cell array 145 are retained by the supply voltage VDD and the ground voltage VSS, a separate refresh operation may not be needed to thereby reduce current consumption. The first cell array 145 may store 'L, L, H and H' in fixed cells accessed by the first word line WL1 and first to fourth bit lines BL1 to BL4, when the supply voltage VDD and the ground voltage VSS are applied thereto. The first cell array 145 may store 'H, L, H, and L' in fixed cells accessed by a second word line WL2 and the first to fourth bit lines BL1 to BL4, when the supply voltage VDD and the ground voltage VSS are applied thereto. In the present embodiment, at least one of the first and second word lines WL1 and WL2 may be selected by the arithmetic row address MRA when the arithmetic active operation is performed. In the present embodiment, at least one of the first to fourth bit lines BL1 to BL4 may be selected by the column address CA when the arithmetic active operation is performed. In the present embodiment, the fixed cells included in the first cell array 145 may be accessed when the arithmetic active operation is performed, and output the first data DA1 stored therein to at least one of the first to fourth bit line sense amplifiers BLSA(1) to BLSA(4). For example, when the arithmetic active operation is performed on the fixed cells accessed by the second word line WL2 and the first to fourth bit lines BL1 to BL4, 'H, L, H, and L' outputted from the first cell array 145 may be outputted to the first to fourth bit line sense amplifiers BLSA(1) to BLSA(4). In an embodiment, the fixed cells included in the first cell array 145 may be accessed when the active operation is performed, and may output the second data DA2 to at least one of the first to fourth bit line sense amplifiers BLSA(1) to BLSA(4). In an embodiment, at least one of the first and second word lines WL1 and WL2 coupled to the fixed cells included in the first cell array 145 may be selected by the row address RA when the active operation is performed. Furthermore, in an embodiment, at least one of the first to fourth bit lines BL1 to BL4 coupled to the fixed cells included in the first cell array 145 may be selected by the column address CA when the active operation is performed.

The second cell array 147 may include cells which are coupled to and accessed by third and fourth word lines WL3 and WL4 and the first to fourth bit lines BL1 to BL4. In the present embodiment, at least one of the third and fourth word lines WL3 and WL4 may be selected by the row address RA when the active operation is performed. In the present embodiment, at least one of the first to fourth bit lines BL1 to BL4 may be selected by the column address CA when the active operation is performed. In the present embodiment, the cells included in the second cell array 147 may be accessed when the active operation is performed, and may output the second data DA2 stored therein to at least one of the first to fourth bit line sense amplifiers BLSA(1) to BLSA(4). In an embodiment, the cells included in the second cell array 147 may be accessed when the arithmetic active operation is performed, and may output the first data DA1 to at least one of the first to fourth bit line sense amplifiers BLSA(1) to BLSA(4). Furthermore, in an embodiment, at least one of the third and fourth word lines WL3 and WL4 coupled to the cells included in the second cell array 147 may be selected by the arithmetic row address MRA when the arithmetic active operation is performed. Furthermore, in an embodiment, at least one of the first to fourth bit lines BL1 to BL4 coupled to the cells included in the second cell array 147 may be selected by the column address CA when the arithmetic active operation is performed.

Figure 5:
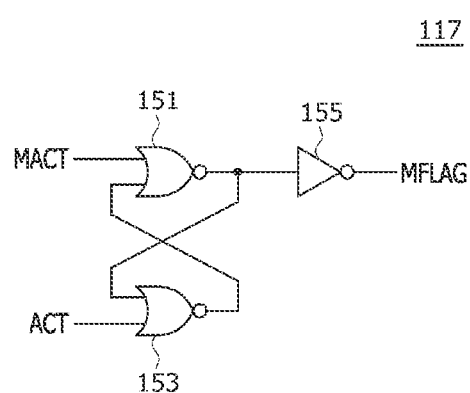
FIG. 5 is a circuit diagram illustrating an example of a flag generation circuit included in the memory device illustrated in FIG. 1.

As illustrated in FIG. 5, the flag generation circuit 117 may include NOR gates 151 and 153 and an inverter 155. The NOR gate 151 may receive the arithmetic active signal MACT and an output signal of the NOR gate 153, and perform a NOR operation on the received signals. The NOR gate 153 may receive the active signal ACT and an output signal of the NOR gate 151, and perform a NOR operation on the received signals. The inverter 155 may generate the arithmetic flag MFLAG by inverting and buffering the output signal of the NOR gate 151. The flag generation circuit 117 may generate the arithmetic flag MFLAG which is activated to a logic high level when the arithmetic active signal MACT is activated to a logic high level. The flag generation circuit 117 may generate the arithmetic flag MFLAG which is deactivated to a logic low level when the active signal ACT is activated.

Figure 6:
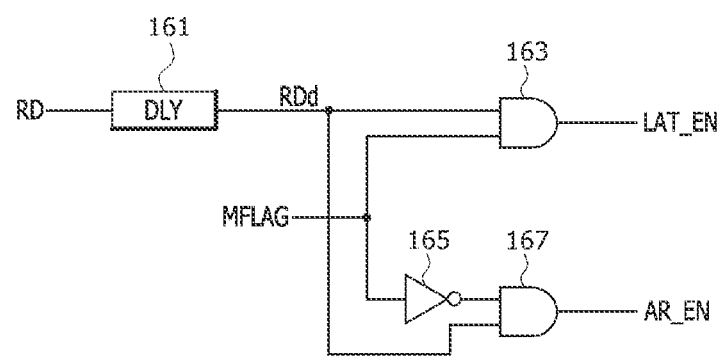
FIG. 6 is a circuit diagram illustrating an example of a control signal generation circuit included in the memory device illustrated in FIG. 1.

As illustrated in FIG. 6, the control signal generation circuit 119 may include a delay circuit 161, AND gates 163 and 167, and an inverter 165. The delay circuit 161 may generate a delayed read signal RDd by delaying the read signal RD by a preset read delay period. The AND gate 163 may receive the delayed read signal RDd and the arithmetic flag MFLAG, and generate the latch control signal LAT_EN by performing an AND operation on the received signals. The inverter 165 may invert and buffer the arithmetic flag MFLAG, and output the inverted signal. The AND gate 167 may receive the delayed read signal RDd and the output signal of the inverter 165, and generate the arithmetic control signal AR_EN by performing an AND operation on the received signals. The control signal generation circuit 119 may generate the latch control signal LAT_EN which is activated to a logic high level when the delayed read signal RDd is activated to a logic high level as the read delay period has elapsed after the read signal RD was activated to a logic high level, with the arithmetic flag MFLAG set to a logic high level by the arithmetic active operation. The control signal generation circuit 119 may generate the arithmetic control signal AR_EN which is activated to a logic high level when the delayed read signal RDd is activated to a logic high level as the read delay period has elapsed after the read signal RD was activated to a logic high level, with the arithmetic flag MFLAG set to a logic low level by the active operation.

Hereafter, the operation of the memory device 100 in accordance with the present embodiment will be described with reference to FIGS. 7 to 18. The operation of the memory device 100 may include a latch data generation operation 31, a read data generation operation 33, and an arithmetic operation 35.

Referring to FIGS. 7 to 13, the latch data generation operation 31 of the memory device 100 will be described as follows.

Figure 7:
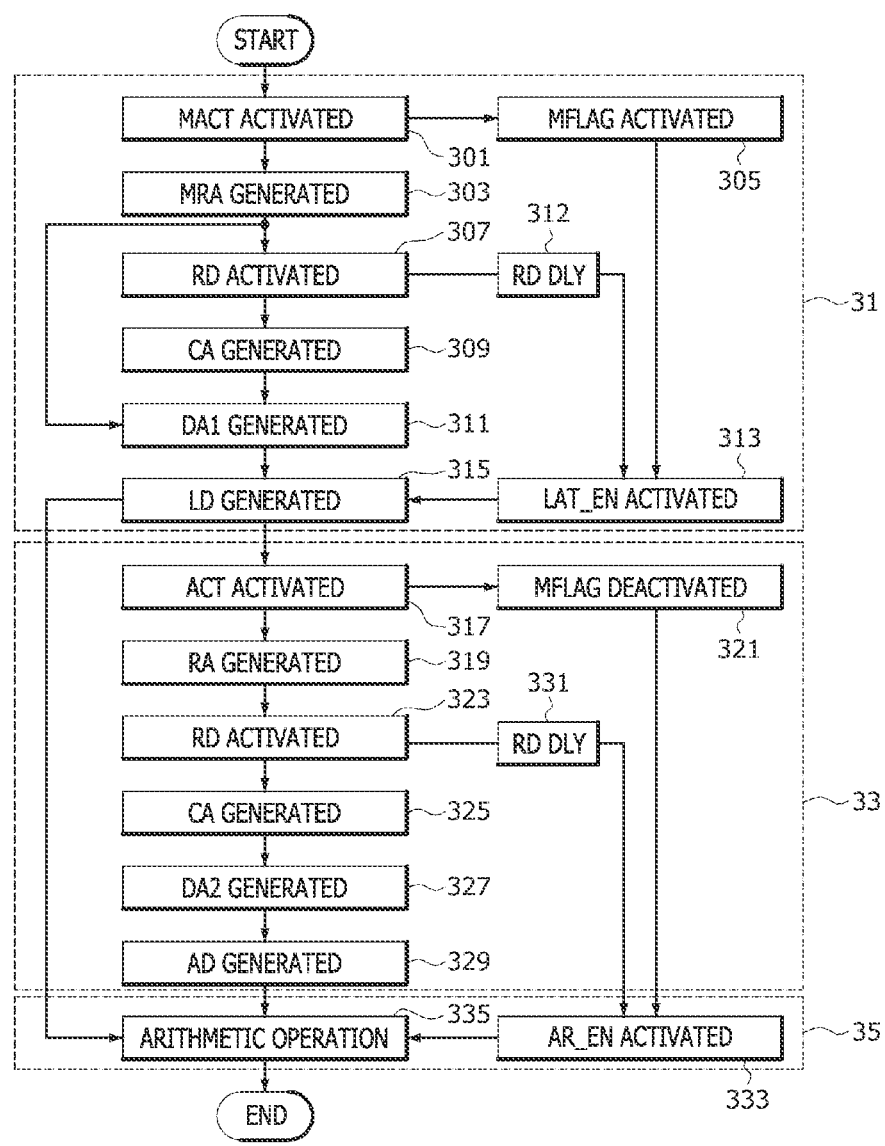
FIGS. 7 to 18 are diagrams for describing an operation of the memory device illustrated in FIGS. 1 to 6.
Figure 8:
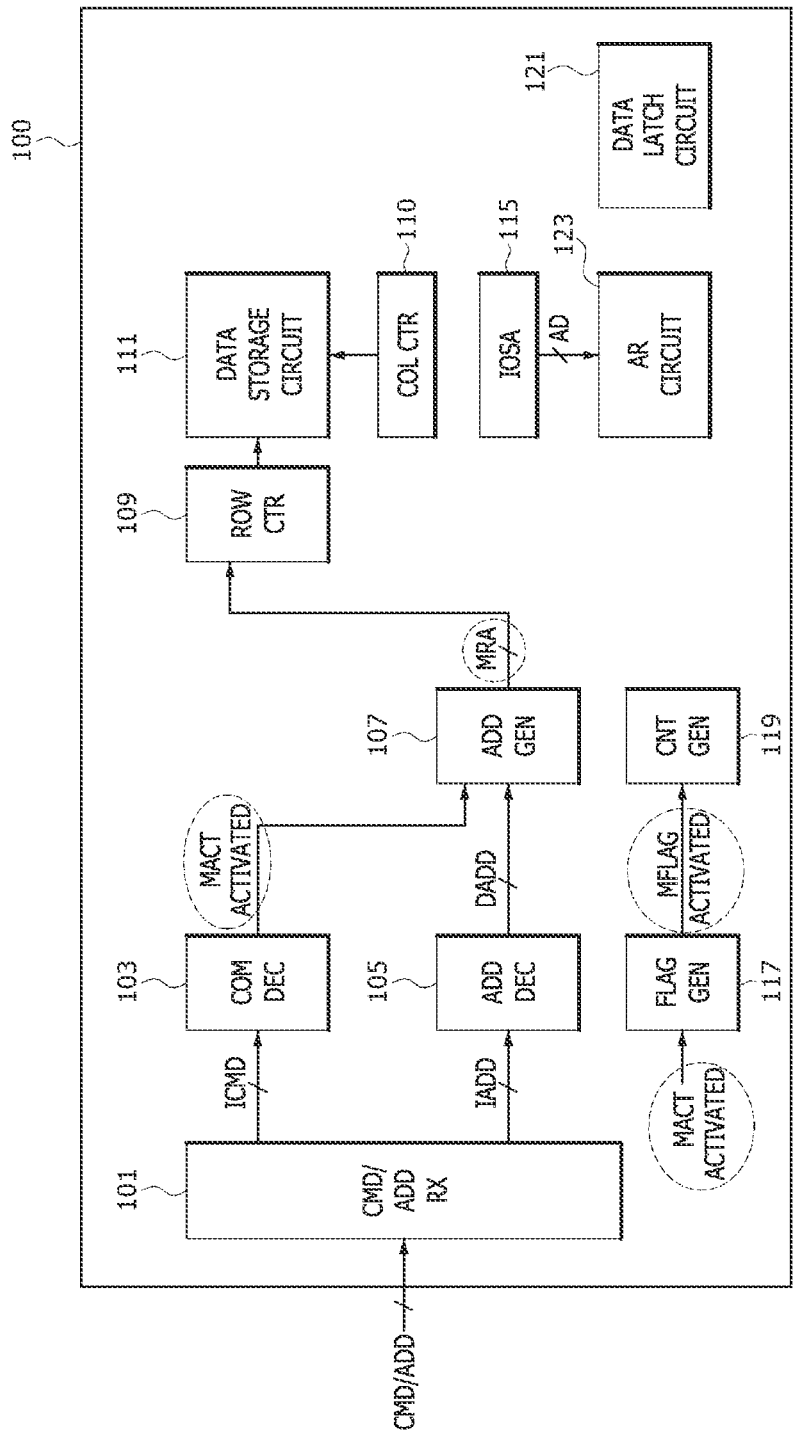
Figure 9:
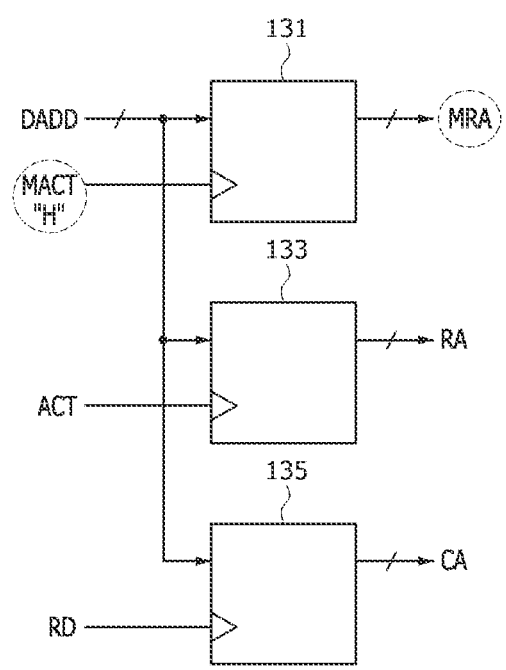

First, as illustrated in FIGS. 7 to 9, when the arithmetic active signal MACT generated by the command decoder 103 is activated to a logic high level 'H' for the arithmetic active operation (301), the arithmetic row address generation circuit 131 included in the address generation circuit 107 may latch the decoded address DADD, and output the latched decoded address DADD as the arithmetic row address MRA (303). The row control circuit 109 may receive the arithmetic row address MRA, and control the data storage circuit 11 to access the cell array having the first data DA1 stored therein, among the cells included in the data storage circuit 111.

Figure 10:
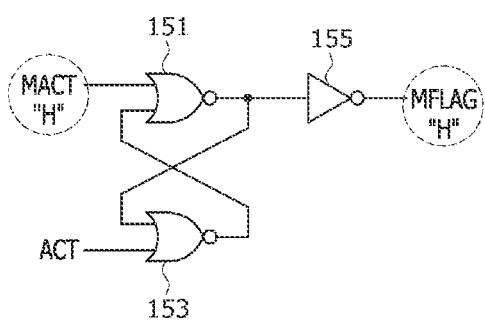

As illustrated in FIGS. 7, 8, and 10, when the arithmetic active signal MACT generated by the command decoder 103 is activated to a logic high level 'H' for the arithmetic active operation (301), the flag generation circuit 117 may generate the arithmetic flag MFLAG which is activated to a logic high level (305).

Figure 11:
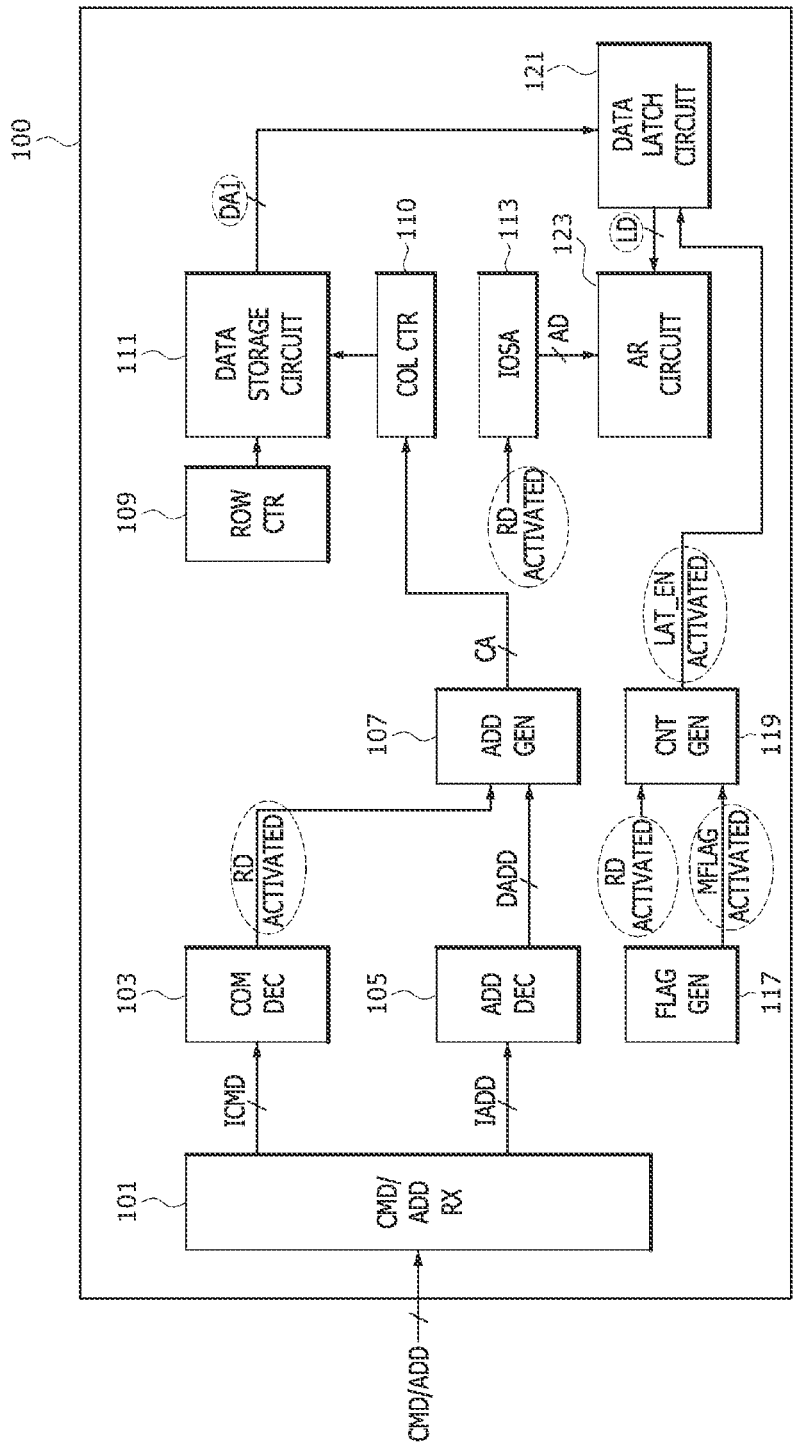
Figure 12:
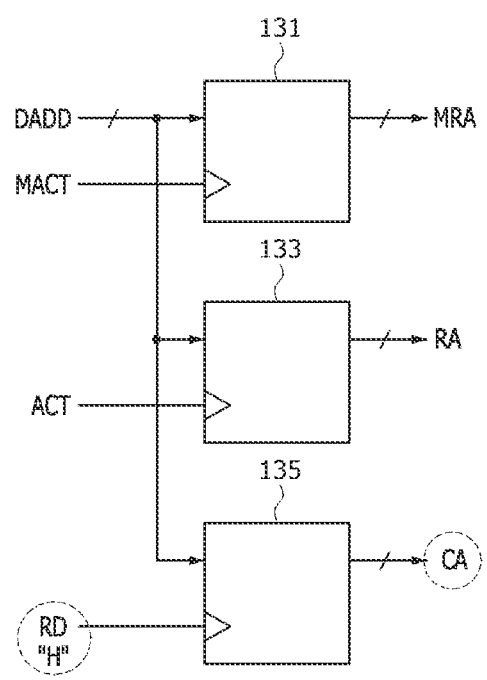

First, as illustrated in FIGS. 7, 11, and 12, when the read signal RD generated by the command decoder 103 is activated to a logic high level 'H' for the first read operation (307), the column address generation circuit 135 included in the address generation circuit 107 may latch the decoded address DADD, and output the latched decoded address DADD as the column address CA (309). The column control circuit 110 may control the data storage circuit 111 to output and apply the first data DA1 to the data latch circuit 121 during the first read operation (311).

Figure 13:
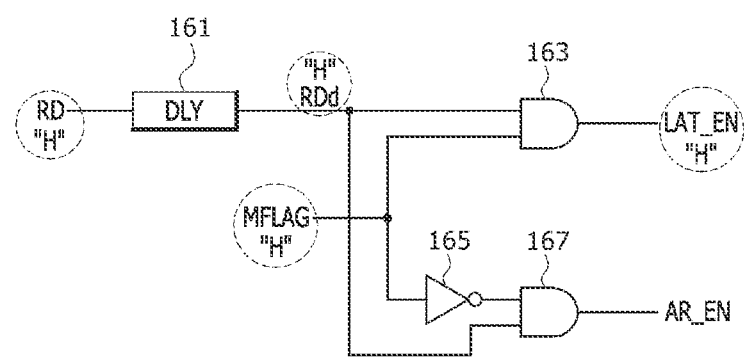

As illustrated in FIGS. 7, 11, and 13, when the delayed read signal RDd is activated to a logic high level as the read delay period RD DLY has elapsed after the read signal RD generated by the command decoder 103 was activated for the first read operation, with the arithmetic active signal MACT activated to a logic high level (312), the latch control signal LAT_EN generated by the control signal generation circuit 119 is activated to a logic high level. The data latch circuit 121 may generate the latch data LD by latching the first data DA1, when the latch control signal LAT_EN is activated to a logic high level (315).

Referring to FIGS. 7 and 14 to 18, the read data generation operation 33 of the memory device 100 will be described as follows.

Figure 14:
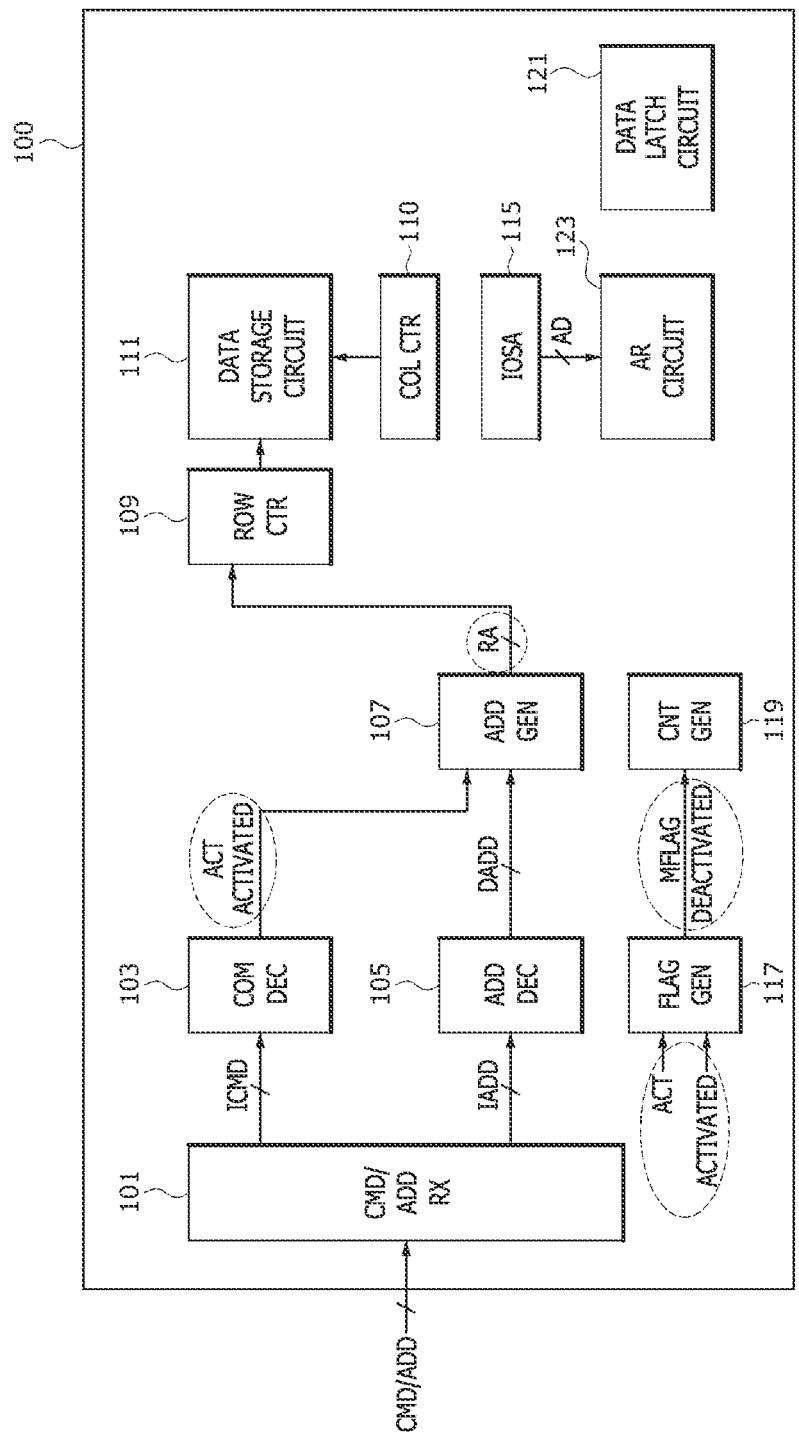
Figure 15:
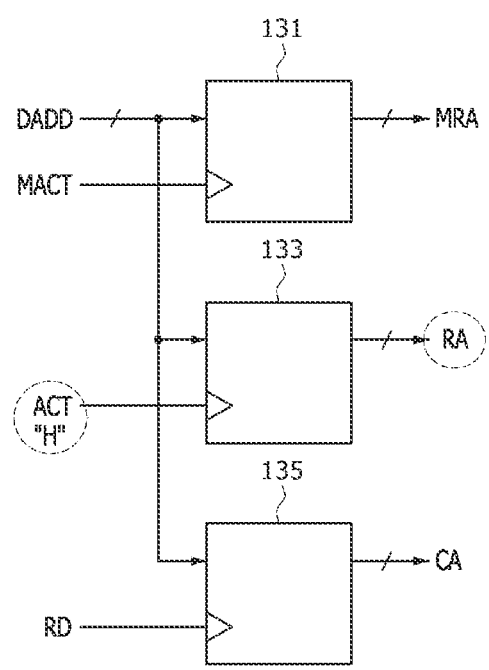

First, as illustrated in FIGS. 7, 14, and 15, when the active signal ACT generated by the command decoder 103 is activated to a logic high level 'H' for the active operation (317), the row address generation circuit 133 included in the address generation circuit 107 may latch the decoded address DADD, and output the latched decoded address DADD as the row address RA (319). The row control circuit 109 may receive the row address RA, and control the data storage circuit 111 to access the cell array having the second data DA2 stored therein, among the cells included in the data storage circuit 111.

Figure 16:
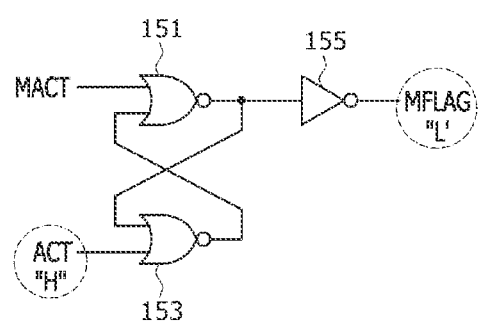

As illustrated in FIGS. 7, 14, and 16, when the active signal ACT generated by the command decoder 103 is activated to a logic high level 'H' for the active operation (317), the flag generation circuit 117 may generate the arithmetic flag MFLAG which is deactivated to a logic low level (321).

Figure 17:
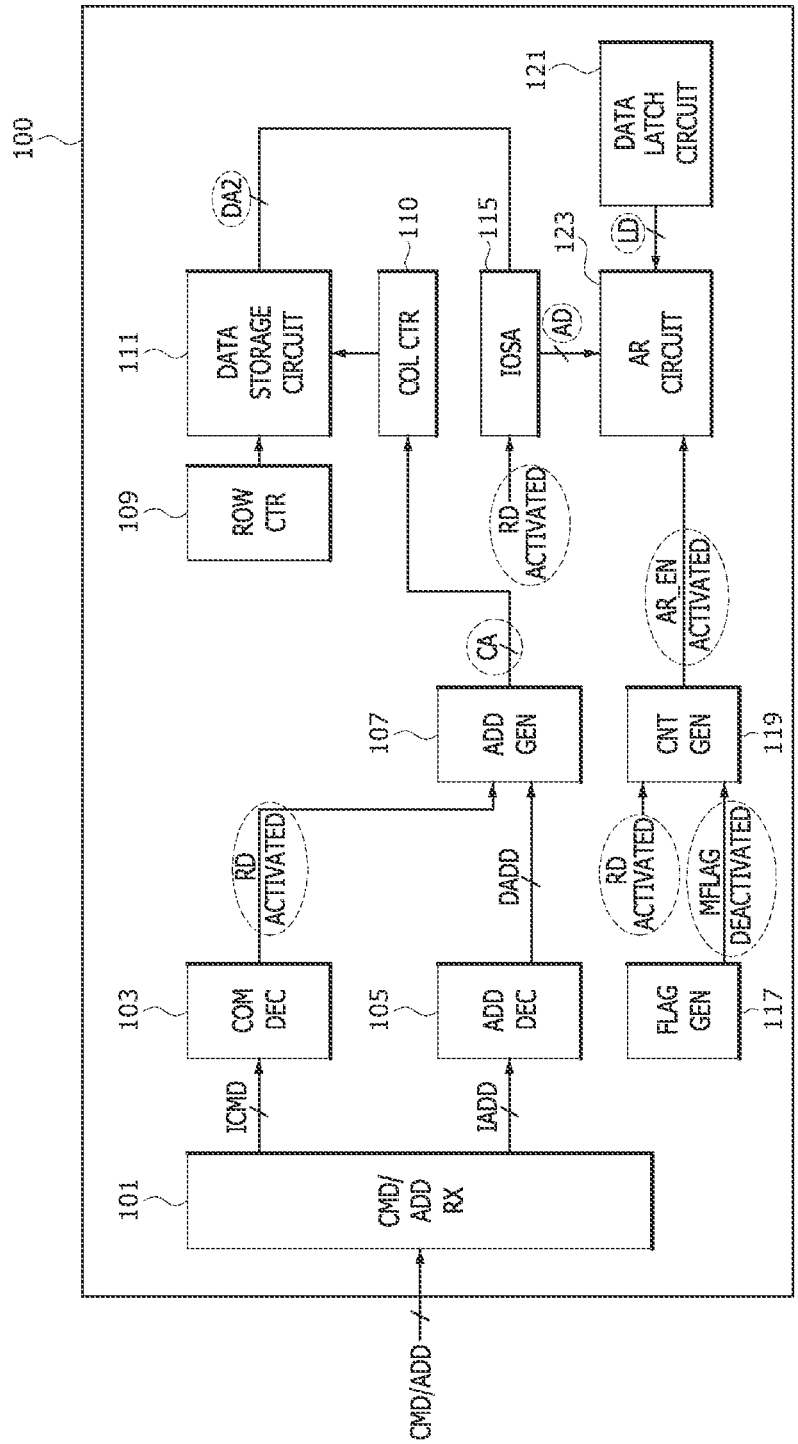

Then, as illustrated in FIGS. 7 and 17, when the read signal RD generated by the command decoder 103 is activated to a logic high level 'H' for the second read operation (323), the column address generation circuit 135 included in the address generation circuit 107 may latch the decoded address DADD, and output the latched decoded address DADD as the column address CA (325). The column control circuit 110 may control the data storage circuit 111 to output and apply the second data DA2 to the data latch circuit 121 during the second read operation (327). The input/output sense amplifier 115 may generate the read data AD by sensing and amplifying the second data DA2 during the second read operation (329).

Figure 18:
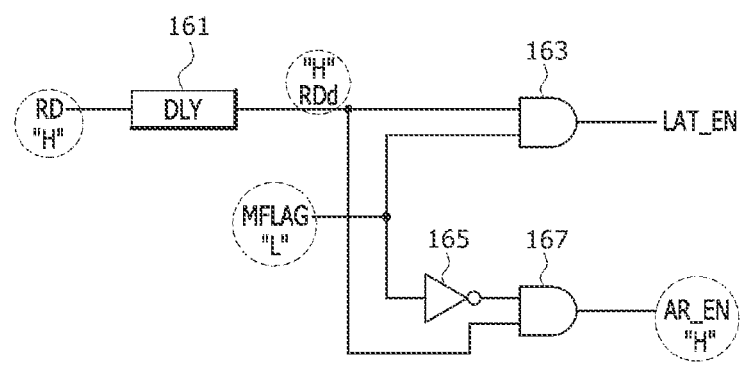

Referring to FIGS. 7 and 17 and 18, the arithmetic operation 35 of the memory device 100 will be described as follows.

As illustrated in FIGS. 7, 17, and 18, when the delayed read signal RDd is activated to a logic high level as the read delay period RD DLY has elapsed after the read signal RD generated by the command decoder 103 was activated for the second read operation, with the active signal ACT activated to a logic high level (331), the arithmetic control signal AR_EN generated by the control signal generation circuit 119 is activated to a logic high level (333).

Finally, the arithmetic circuit 123 may perform an arithmetic operation on the latch data LD and the read data AD when the arithmetic control signal AR_EN is activated (335).

The above-described memory device 100 in accordance with the present embodiment may store data used for an arithmetic operation in a cell array accessed by an address, thereby storing the data used for the arithmetic operation in a small area. Furthermore, in the memory device 100 in accordance with the present embodiment, the cell array configured to store the data used for the arithmetic operation may be implemented as cells configured to store data whose logic levels are set by the supply voltage. Thus, the data can be stored in the cells without a write operation, which makes it possible to reduce the current consumption required for the arithmetic operation. Furthermore, in the memory device 100 in accordance with the present embodiment, the cell array configured to store the data used for the arithmetic operation may be implemented as cells configured to store data whose logic levels are set by the supply voltage. Thus, a refresh operation for retaining the data stored in the cells does not need to be performed, which makes it possible to reduce the current consumption required for the arithmetic operation.

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:
1. A memory device comprising:
a data storage circuit configured to:
   access a first cell array having first data stored therein when an arithmetic active operation is performed,
   output the first data when a first read operation is performed,
   access a second cell array having second data stored therein when an active operation is performed, and
   output the second data when a second read operation is performed; and an arithmetic circuit configured to:
   receive latch data generated through the first read operation and read data generated through the second read operation, and
   perform an arithmetic operation on the latch data and the read data.

2. The memory device of claim 1, further comprising a command decoder configured to:
   generate an arithmetic active signal which is activated to perform the arithmetic active operation, based on an internal command,
   generate an active signal which is activated to perform the active operation, based on the internal command, and
   generate a read signal which is activated to perform the first or second read operation, based on the internal command.

3. The memory device of claim 1, wherein the memory device is configured to:
   perform the first read operation after the arithmetic active operation is performed,
   perform the active operation after the first read operation is performed, and
   perform the second read operation after the active operation is performed.

4. The memory device of claim 1, further comprising a row control circuit configured to:
   receive an arithmetic row address which is generated when the arithmetic active operation is performed, and
   control the data storage circuit to access the first cell array having the first data stored therein.

5. The memory device of claim 1, further comprising a column control circuit configured to:

receive a column address which is generated when the first read operation is performed, and control the data storage circuit to output the first data stored in the first cell array accessed by the arithmetic active operation.

6. The memory device of claim 1, further comprising a column control circuit configured to:

receive a column address which is generated when the second read operation is performed, and control the data storage circuit to output the second data stored in the second cell array accessed by the active operation.

7. The memory device of claim 1, further comprising an input/output sense amplifier configured to generate the read data by sensing and amplifying the second data when the second read operation is performed.

8. The memory device of claim 1, further comprising a control signal generation circuit configured to:

generate a latch control signal based on the arithmetic active operation and the first read operation, and generate an arithmetic control signal based on the active operation and the second read operation.

9. The memory device of claim 8, further comprising a data latch circuit configured to:

latch the first data based on the latch control signal, and output the latched first data as the latch data.

10. The memory device of claim 8, wherein the control signal generation circuit comprises:

a delay circuit configured to generate a delayed read signal by delaying a read signal by a preset read delay period;

a first AND gate configured to generate the latch control signal based on the delayed read signal and an arithmetic flag; and a second AND gate configured to generate the arithmetic control signal based on the delayed read signal and an inverted signal of the arithmetic flag.

11. The memory device of claim 10, further comprising a flag generation circuit configured to:

generate the arithmetic flag which is activated when the arithmetic active operation is performed, and generate the arithmetic flag which is deactivated when the active operation is performed.

12. The memory device of claim 1, wherein the arithmetic operation comprises:

an addition operation;
a multiplication operation;
a division operation; and
a multiply-accumulate (MAC) operation.

13. A memory device comprising:
a row control circuit configured to:
receive an arithmetic row address which is generated when an arithmetic active operation is performed, and
control a data storage circuit to access a first cell array having first data stored in the first cell array;
a column control circuit configured to:
receive a first column address which is generated when a first read operation is performed, and
control the data storage circuit to output the first data stored in the first cell array accessed by the arithmetic active operation; and
a data latch circuit configured to:
latch the first data based on a latch control signal, and
output the latched first data as latch data used for an arithmetic operation.

14. The memory device of claim 13, wherein the row control circuit is configured to:

receive a row address which is generated when an active operation is performed, and control the data storage circuit to access a second cell array having second data stored therein.

15. The memory device of claim 14, wherein the column control circuit is configured to:

receive a second column address which is generated when a second read operation is performed, and control the data storage circuit to output the second data stored in the second cell array accessed by the active operation.

16. The memory device of claim 15, further comprising:

an input/output sense amplifier configured to generate read data by sensing and amplifying the second data when the second read operation is performed; and an arithmetic circuit configured to perform an arithmetic operation on the latch data and the read data.

17. The memory device of claim 15, further comprising a control signal generation circuit configured to:

generate the latch control signal based on the arithmetic active operation and the first read operation, and generate an arithmetic control signal based on the active operation and the second read operation.

18. The memory device of claim 17, wherein the control signal generation circuit comprises:

a delay circuit configured to generate a delayed read signal by delaying a read signal by a preset read delay period;

a first AND gate configured to generate the latch control signal based on the delayed read signal and an arithmetic flag; and a second AND gate configured to generate the arithmetic control signal based on the delayed read signal and an inverted signal of the arithmetic flag.

19. The memory device of claim 18, further comprising a flag generation circuit configured to:

generate the arithmetic flag which is activated when the arithmetic active operation is performed, and generate the arithmetic flag which is deactivated when the active operation is performed.

20. The memory device of claim 13, wherein the arithmetic operation comprises:

an addition operation;
a multiplication operation;
a division operation; and
a multiply-accumulate (MAC) operation.

21. A memory device comprising:
a row control circuit configured to:
receive an arithmetic row address which is generated when an arithmetic active operation is performed,
control a data storage circuit to access a first cell array having first data stored in the first cell array,
receive a row address which is generated when an active operation is performed, and
control the data storage circuit to access a second cell array having second data stored in the second cell array;
a column control circuit configured to:
receive a first column address which is generated when a first read operation is performed,
control the data storage circuit to output the first data stored in the first cell array accessed by the arithmetic active operation,
receive a second column address which is generated when a second read operation is performed, and control the data storage circuit to output the second data stored in the second cell array accessed by the active operation;
a data latch circuit configured to:
  latch the first data based on a latch control signal, and
  output the latched first data as latch data;
an input/output sense amplifier configured to generate read data by sensing and amplifying the second data when the second read operation is performed; and
an arithmetic circuit configured to perform an arithmetic operation on the latch data and the read data.

* * * * *